United States Patent
Yamamoto et al.

[11] Patent Number: 6,061,011
[45] Date of Patent: May 9, 2000

[54] NONFLAMMABLE RADIO WAVE ABSORBER

[75] Inventors: Osamu Yamamoto; Yasuhiro Ogura, both of Tokyo; Hiroo Takahashi, Funabashi; Yasuo Imashiro, Tokyo; Shun Hasegawa, Tokyo; Hidefumi Sano, Tokyo, all of Japan

[73] Assignees: Nisshinbo Industries, Inc.; Nisshinbo Tempest, Inc., both of Tokyo, Japan

[21] Appl. No.: 09/297,616

[22] PCT Filed: Sep. 4, 1998

[86] PCT No.: PCT/JP98/03975

§ 371 Date: May 5, 1999

§ 102(e) Date: May 5, 1999

[87] PCT Pub. No.: WO99/13697

PCT Pub. Date: Mar. 18, 1999

[30] Foreign Application Priority Data

Sep. 9, 1997 [JP] Japan ................................ 9-259403

[51] Int. Cl.[7] .................................................. H05K 9/00
[52] U.S. Cl. ..................................... 342/1; 342/4
[58] Field of Search ............................... 342/1, 4

[56] References Cited

U.S. PATENT DOCUMENTS

| | | |
|---|---|---|
| 4,334,971 | 6/1982 | Mahnke et al. . |
| 4,511,678 | 4/1985 | Mahnke et al. . |
| 4,540,717 | 9/1985 | Mahnke et al. . |
| 5,396,249 | 3/1995 | Yamada et al. . |
| 5,436,278 | 7/1995 | Imashiro et al. . |

FOREIGN PATENT DOCUMENTS

| | | |
|---|---|---|
| 10007671 | 2/1990 | European Pat. Off. . |
| 0485635A1 | 4/1992 | European Pat. Off. . |
| 55-142628 | 11/1980 | Japan . |
| 56-152848 | 11/1981 | Japan . |
| 2-648480 | 2/1989 | Japan . |
| 1-194398 | 8/1989 | Japan . |
| 2-145237 | 10/1989 | Japan . |
| 2-88298 | 3/1990 | Japan . |
| 2-102797 | 4/1990 | Japan . |
| 2-174295 | 7/1990 | Japan . |
| 3-99496 | 4/1991 | Japan . |
| 3-204999 | 6/1991 | Japan . |
| 4-44300 | 2/1992 | Japan . |
| 6-94193 | 4/1994 | Japan . |
| 6-314894 | 11/1994 | Japan . |
| 7-157590 | 6/1995 | Japan . |

OTHER PUBLICATIONS

Shinozaki et al., "Development of Incombustible radio frequency (RF) absorber" Electromagnetic Compability, Symposium Record., 1995 IEEE International Symposium on, pp. 557–562, 1995.

*Primary Examiner*—Ian J. Lobo

[57] ABSTRACT

An incombustible wave absorber of the application-on-the-spot type includes a wave absorber body, and a cap attached to the absorber body wherein the absorber body is composed of a board for setting up a wave absorber made of a carbon-containing inorganic short fiber board or organic foam board and has folding portions and/or bonding portions which permit the board to be set up on the spot in the form of a hollow pyramid, wedge, polygon or corrugation, and the board is set up, on the spot, in the form of a hollow pyramid, wedge, polygon or corrugation to provide the absorber body, which is attached to the surfaces of walls, a ceiling or a floor of a field-free chamber.

8 Claims, 3 Drawing Sheets

NONFLAMMABLE RADIO WAVE ABSORBER

This application is the national phase under 35 U.S.C. § 371 of PCT International Application No. PCT/JP98/03975 which has an International filing date of Sep. 4, 1998, which designated the United States of America.

TECHNICAL FIELD

This invention relates to an incombustible wave absorber, which is usable, for example, in field-free chambers and is made of a dielectric loss material having good sound-absorbing properties along with good radio wave-absorbing properties at wide-band frequencies. More particularly, the invention relates to an incombustible wave absorber, which is able to be set up and attached to on the spot where it is applied to the surfaces of walls, ceilings and floors of a field-free chamber.

BACKGROUND ART

Field-free or anechoic chambers have been in wide use for measurement of various characteristics of antennas, tests of measuring instruments of electromagnetic field intensity, measurement of the radiation of disturbing waves, and the like. In order to completely remove reflection of radio waves in the chamber, such a field-free chamber is so constructed as to be covered with a wave absorber on the surfaces of walls, ceilings and floors of an electromagnetic wave-shielding or insulating chamber.

Ordinarily employed wave absorbers are ones, which are made of composite resin foams obtained by a method such as impregnation of a dielectric loss material, such as carbon, or coating of the material onto foam beads. Thereafter, the resin foams are shaped in the form of a solid pyramid, wedge, polygon or corrugation. When a radio wave enters an absorber, this type of pyramid or wedge-shaped wave absorber gradually changes an impedance from its surface so as not to reflect the wave, thereby realizing good absorption properties over a wide-band frequency range.

However, the absorption properties are not satisfactory within a low frequency range. Accordingly, usual practice is to use, in combination, ferrite tiles having good absorption properties within a narrow-band frequency range.

Examples of the resin foam-based wave absorber containing a dielectric loss material include solid pyramid-shaped, wedge-shaped, polygonal or corrugated articles, which are made of composite materials obtained by uniformly distributing a dielectric loss material, such as carbon, in resin foams, such as polystyrene foams, urethane foams, polyethylene foams and the like, or coating the dielectric loss material onto foam beads.

However, since the wave absorber made of a resin foam is combustible in nature, a radio wave with great electric power is continuously forced into the absorber, whereupon it generates heat from the inside thereof with the great possibility that the absorber takes fire and burns. Thus, there is a demand for fireproofing of the absorber.

Moreover, the wave absorbers made of polyurethane foams, polyethylene foams and the like resin foams are so soft that when processed in the form of a pyramid, its sharp tip ends may hang down. In addition, they are liable to absorb moisture therein, with the attendant problem on their quality that they are poor in shape retention and durability.

On the other hand, polystyrene foams are not satisfactory with respect to their wave absorption properties, coupled with another problem that they are brittle. Further, the wave absorbers made of these resin foams are dark in color and poor in design properties, thus leaving the problem that they give a physiological pressure to a person in charge of measurement.

In order to cope with such problems as set out above, Japanese Laid-open Patent Application No. Hei 6-314894 proposes a wave absorber made of a phenolic resin foam, which is semi-incombustible or incombustible.

The wave absorber made of a phenolic resin foam is made according to a mode molding method wherein a carbon-containing phenolic resin is charged into a mold inserted with an incombustible, light-colored paper cap, followed by foaming and curing, thus substantially solving the above-stated problems.

Although wave absorbers shaped in the form of a solid pyramid, wedge or polygon have been set forth hereinabove, there is also proposed a hollow pyramid-shaped resin foam wave absorber (Japanese Laid-open Patent Application No. Hei 4-44300).

This absorber is one wherein a carbon-containing urethane resin foam is processed in the form of a hollow pyramid. The absorber aims at improving impedance matching with ferrite tiles at a bottom surface and also improving wave absorption properties, not at solving the above-mentioned problems on fireproofing, durability and shape retention.

On the other hand, there are disclosed techniques relating to solid or hollow pyramid-shaped wave absorbers made of inorganic fibers (Japanese Patent Publication Nos. Sho 64-8480, Hei 1-45237 and Japanese Laid-open Patent Application No. Hei 3-99496).

Such wave absorbers are made of composite materials obtained by incorporating dielectric loss materials, such as carbon, into glass wool or ceramic wool by impregnation and processed in the form of a pyramid. Although the absorbers are satisfactory with respect to fireproofing and absorption properties, the compositing and processing procedures are complicated, thus involving design and cost problems.

DISCLOSURE OF THE INVENTION

An object of the invention is to provide a wave absorber which is inexpensive and is made of a composite material including a dielectric loss material.

Another object of the invention is to provide a wave absorber which has good absorption properties in a wide-band frequency range along with good acoustic characteristics including wave absorption properties.

A further object of the invention is to provide a wave absorber having good design properties.

A still further object of the invention is to provide a wave absorber which is able to be set up on the application spot and applied to wall, ceiling and floor surfaces of a field-free chamber, thereby considerably reducing costs and improving applicability.

Still another object of the invention is to provide a wave absorber which is usable in both a field-free chamber and an anechoic chamber because it is imparted with acoustic characteristics, and thus, has a great merit on the part of users due to the fact that it is not necessary for them to have both chambers separately.

These objects can be achieved by the following incombustible wave absorber of the application-on-the-spot type.

According to the invention, there is provided an incombustible wave absorber of the application-on-the-spot type which comprises:

a wave absorber body made of a board selected from the group consisting of (a) an incombustible, carbon-containing, inorganic short fiber board wherein fine powder of carbon is deposited on the surfaces of inorganic short fibers, (b) an incombustible carbon-containing inorganic short fiber board obtained by laminating, on one or both sides of an inorganic short fiber board, a fire-retardant or incombustible organic or inorganic fiber-woven or non-woven fabric having a carbon fine powder-containing resistance film therein, (c) an organic foam board having carbon fine powder incorporated in a melamine resin foam by impregnation, and (d) a board obtained by laminating, on one side or both sides of an organic foam board having carbon fine powder incorporated in a melamine resin foam by impregnation, an organic or inorganic fiber-woven or non-woven fabric, or a fire-retardant or incombustible organic or inorganic fiber-woven or non-woven fabric having a carbon fine powder-containing resistance film formed therein, wherein the board is formed with folding portions and/or bonding portions so that the board is able to be set up on the spot in the form of a hollow pyramid, wedge, polygon or corrugation, and is set up in the form of the hollow pyramid, wedge, polygon or corrugation to provide a wave absorber body to be attached to surfaces of walls, a ceiling or a floor of a field-free chamber; and an incombustible cap mounted on said absorber body.

More particularly, the invention is characterized in that the incombustible wave absorber of the application-on-the-spot type includes the board selected from those boards indicated under (a) to (d) above is subjected to die cutting beforehand in a developed pattern capable of being folded and bonded in the form of a pyramid, wedge, polygon or corrugation, thereby providing a folding board, and the folding board is set up in the form of a hollow pyramid, wedge, polygon or corrugation on an application spot for a field-free chamber, and an incombustible cap is mounted on the setup board.

BEST MODE FOR CARRYING OUT THE INVENTION

The wave absorber of the invention comprises a wave absorber body, a cap therefor, and a base or pedestal, if necessary. These are described in detail below.

Wave absorber body

The wave absorber body is constituted of the board selected from those indicated under (a) to (d) below. This board is processed into a folding board for wave absorber which has been formed with folding portions and/or bonding portions so that it can be set up on the spot in the form of a hollow pyramid, wedge, polygon or corrugation. The thus processed folding board is set up into a hollow pyramid, wedge, polygon or corrugation to provide a wave absorber body.

In the practice of the invention, the folding board is assembled into a hollow pyramid, wedge, polygon or corrugation on the spot for a field-free chamber to form a wave absorber body, followed to attachment to wall, ceiling or floor surfaces of the field-free chamber.

(a) An incombustible, carbon-containing, inorganic short fiber board wherein fine powder of carbon is deposited on the surfaces of inorganic short fibers, (b) An incombustible carbon-containing inorganic short fiber board obtained by laminating, on one or both sides of an inorganic short fiber board, a fire-retardant or incombustible organic or inorganic fiber-woven or non-woven fabric having a carbon fine powder-containing resistance film therein, (c) An organic foam board having carbon fine powder incorporated in a melamine resin foam by impregnation, and (d) A board obtained by laminating, on one side or both sides of an organic foam board having carbon fine powder incorporated in a melamine resin foam by impregnation, an organic or inorganic fiber-woven or non-woven fabric, or a fire-retardant or incombustible organic or inorganic fiber-woven or non-woven fabric having a carbon fine powder-containing resistance film formed therein.

The boards of (a) and (b) are made of inorganic short fiber boards having carbon fine powder incorporated therein. From the standpoint of the economy and heat resistance, mention may be made, as the inorganic short fibers used for this purpose, of glass wool, rock wool, from which non-fibrous particles (shots) have been removed, and the like.

The glass wool used herein means short fibers, which have a diameter of 4 to 10 $\mu$m and are generally obtained by melting, in an electric furnace, a starting material composed of 65 to 70 wt % of $SiO_2$, 2 to 4 wt % of $Al_2O_3$, 2 to 4 wt % of $B_2O_3$, 6 to 8 wt % of CaO, 2 to 4 wt % of MgO, and 14 to 16 wt % of $K_2O+Na_2O$ and forming the melt into fibers according to a blowing process or a spinning process (TEL process) using a perforated high speed rotating body.

For the fabrication of an inorganic short fiber board, while a solution of a water-soluble phenolic resin serving as a binder is blown from a plurality of nozzles in a fiber-forming process, the fibers are collected in the form of a mat, followed by compression, heating and curing to obtain the board. In the case, conductive carbon fine powder may be dispersed in the water-soluble phenolic resin solution and sprayed over the fibers, or a carbon aqueous dispersion may be blown against the fiber from nozzles different from the binder-spraying nozzles in such a way that the binder and carbon are, respectively, deposited on a final board in desired amounts. Eventually, there can be obtained a carbon-containing uncured glass wool board according to a dry process.

From the standpoint of incombustibility, wave absorption properties, and acoustic absorption properties, this glass wool board should preferably have an amount of a deposited phenolic resin of 2 to 10 wt %, a carbon concentration of 0.5 to 20 g/liter, a bulk density of the processing material of 30 to 200 kg/m$^3$, and a thickness of 5 to 20 mm after the board has been subjected to final hot pressing into a shape capable of being set up. If these characteristic properties are, respectively, outside the ranges defined above, satisfactory incombustibility, wave absorption properties, acoustic absorption properties and processability may not be obtained.

Rock wool, which is other type of inorganic short fiber, can be made in the following manner. A starting material made generally of 35 to 50 wt % of $SiO_2$, 11 to 16 wt % of $Al_2O_3$, 15 to 35 wt % of CaO, 5 to 15 wt % of MgO, 1 to 2 wt % of $TiO_2$, and 0.2 to 7 wt % of FeO is melted in a cupola or electric furnace, from which fibers are formed according to a spinning process using 2 to 4 high speed rotation bodies in combination, followed by collection of fibers, compressing and packaging to obtain the inorganic short fibers (granular cotton). Such a granular cotton is dispersed in a pulper for paper-making, defibrated, and cut into finer pieces, followed by passing through a cleaner unit for separating and removing shots therefrom to obtain a shot-removed rock wool usable in the present invention.

The shot-removed rock wool is subsequently formulated with carbon fine powder, a binder such as a phenolic resin or acrylic resin emulsion, a small amount of organic fibers, a dispersion aid, and a coagulant to obtain a slurry. A felt is made by use of the slurry by passing through a Fourdrinier or rotoformer-type paper-making machine and dried in an uncured state to obtain a carbon-containing rock wool felt.

In view of the incombustibility, sound absorbing qualities, and processability, the material obtained by final hot pressing and processing in a pattern capable of being set up in a desired shape should preferably have a binder content of 2 to 7 wt %, a carbon concentration of 0.5 to 20 g/liter, a bulk density of 200 to 400 kg/m$^3$, and a thickness of 5 to 20 mm. If these characteristic properties are outside the above-defined ranges, respectively, satisfactory incombustibility, wave absorption properties, acoustic absorption properties and processability may not be expected.

The uncured glass wool boards or rock wool felts may be used singly or stacked in plural layers, after which it is hot pressed and cured in the form of a plate, polygon or corrugation having a desired carbon concentration, a bulk density and a thickness, thereby making a board for use as a wave absorber.

Where uncured boards or felts are shaped after stacking, it is possible to use uncured boards or felts having different carbon concentrations in combination. In doing so, while an input impedance (377 Ω) and a characteristic impedance of the material are matched, the carbon concentration can be changed, for example, from a low level to a high level (as viewed from top to bottom). This eventually enables the impedance to be changed, thus making it possible to obtain better wave absorption properties.

When uncured boards or felts are subjected to thermoforming in such a way that an organic or inorganic thin non-woven fabric is used to cover the board or felt on opposite sides thereof, die cutting, bonding and handling properties of the board or felt can be improved. Thus, the use of such a non-woven fabric within a range not impeding incombustibility is convenient.

On the other hand, the melamine resin foam, which is used as melamine resin foam boards (c) and (d) distributed with carbon fine powder therein, may be any of the known melamine resin foams obtained by foaming resin compositions composed mainly of melamine-formaldehyde condensates and foaming agents.

For instance, the melamine-formaldehyde condensate can be obtained by mixing melamine, formalin and paraformaldehyde and subjecting the mixture to thermal reaction in the presence of an alkali catalyst. In this case, the mixing ratio by mole between melamine and formaldehyde is generally 1:2 to 4, preferably 1:3.

The thus obtained melamine-formaldehyde condensate should preferably have a viscosity of 1,000 to 100,000 cP at 25° C., more preferably 5,000 to 15,000 cP. The pH should preferably be within a range of 8 to 9.

The foaming agents include, for example, linear alkyl hydrocarbons, of which pentane and hexane are preferably used.

In order to obtain a uniform foam, emulsifiers may be added to the resin composition composed mainly of a melamine-formaldehyde condensate and a foaming agent. Examples of such an emulsifier include metal salts of alkylsulfonic acids and metal salts of alkylarylsulfonic acids, of which sodium dodecylbenzenesulfonate is preferred.

For curing of a foamed resin composition, curing agents may be added to the resin composition. Examples of the curing agent include acidic curing agents, of which formic acid, hydrochloric acid, sulfuric acid and oxalic acid are preferred.

The foam used in the practice of the invention can be obtained in the following manner. The resin composition composed mainly of such melamine-formaldehyde condensate and foaming agent as mentioned above are admixed with such emulsifier and curing agent as mentioned above, if necessary, and optionally further with additives such as a filler and the like, followed by thermal treatment at temperatures higher than a boiling point of the foaming agent used and curing the resultant foam.

The method of making such a foam as set out above is described, for example, in Japanese Laid-open Patent Application Nos. Sho 55-142628 and Sho 56-152848. Moreover, isocyanate-modified melamine resin foams may also be used in the present invention. The manufacture of such a foam is described in Japanese Laid-open Patent Application No. Hei 7-157590.

The carbon fine powder can be incorporated into a melamine-formaldehyde foam in a manner which ensues. A melamine resin foam is dipped in a treating dispersion containing a carbon fine powder, a binder and additives until the dispersion is well impregnated in the foam to the inside thereof.

Next, the melamine-formaldehyde foam is removed from the dispersion, and an excess dispersion may be naturally dropped or uniformly squeezed by means of rollers or a press, and dried. For the dipping, the foam may be allowed to stand in the dispersion for several hours. Alternatively, the foam may be repeatedly compressed and released in the dispersion, so that air in the inside thereof is forced out, thereby causing the dispersion to be impregnated more rapidly.

For this purpose, there may be used impregnating machines ordinarily employed for the impregnation in polyurethane foams. It will be noted that the impregnation to the inside of a melamine-formaldehyde resin foam is feasible within a smaller number of repetition cycles of compression and release than in the case of polyurethane foams.

It is preferred that carbon fine powder is incorporated or distributed by impregnation in a melamine resin foam in an amount ranging from 0.5 to 30 kg/m$^3$. If the amount of the incorporated carbon fine powder is lower than the above-defined range, satisfactory wave absorption properties may not be obtained. On the other hand, when the amount of the carbon fine powder exceeds the range, there is the possibility that a layer of the carbon fine powder is formed in the skeletal surfaces, which reflect part of incident waves, thereby lowering wave absorption properties.

The composite melamine resin foam board having carbon fine powder contained therein may be used after slicing into a desired thickness prior to or after the impregnation of a carbon fine powder dispersion.

The thus obtained melamine resin foam should preferably have a bulk density of 8 to 13 kg/m$^3$, a thickness of 5 to 20 mm, and a carbon concentration of 0.5 to 30 g/liter.

When the board is covered, on opposite sides thereof, with an organic or inorganic thin non-woven or woven fabric, die-cutting, bonding and handling properties are improved as described hereinafter. Such a covering technique is described, for example, in Japanese Patent Publication No. Hei 6-94193.

The melamine resin foam board of (c) exhibits self-extinguishing properties when determined according to a combustion test described in JIS A 9511.

In the practice of the invention, carbon fine powder should preferably be ones which exhibit a satisfactory dielectric loss relative to an incident electromagnetic wave with a high frequency. Especially, those powders, which are conductive and have a relatively large particle size and a specific surface area, are more preferably used.

As such a material, mention is made, for example, of carbon black, graphite and the like. The particle size should preferably be in the range of 15 to 100 nm and a specific surface area of 100 to 1500 $m^2/g$.

As the flame-retardant or incombustible organic or inorganic fiber-woven or non-woven fabrics formed with the carbon fine powder-containing resistance film and used to obtain the boards (b) and (d), there may be used, for example, glass fiber-woven or non-woven fabrics, ceramic paper, flame-retardant woven or non-woven fabrics, fireproof fiber-woven or non-woven fabrics, flame-retardant polyester woven fabrics, aramid fiber-woven fabrics, Kynol fiber-woven fabrics and the like. These fabrics are not mentioned for limitation, but other ordinarily available flame-retardant or incombustible woven or non-woven fabrics may also be used. Carbon fine powder may be contained in the course of fabrication of woven or non-woven fabrics. Alternatively, the fine powder may be contained in woven or non-woven fabrics after fabrication thereof by techniques such as of dipping, coating and the like.

As the organic or inorganic fiber-woven or non-woven fabric used to obtain the board (d), there may be used, for example, glass fiber-woven or non-woven fabrics, ceramic paper, flame-retardant rayon woven or non-woven fabrics, fireproof fiber-woven or non-woven fabrics, flame-retardant polyester woven fabrics, aramid fiber-woven fabrics, and Kynol fiber-woven fabrics. These fabrics are not mentioned for limitation, but other ordinarily available flame-retardant or incombustible woven or non-woven fabrics may be used as well.

The thickness of the boards (a) to (d) is not critical and is generally in the range of about 5 mm to 50 mm, preferably 10 mm to 30 mm.

In practice, the boards (a) to (d) are formed with folding portions and/or bonding portions in a pattern capable of setting up, on the spot, in the form of a hollow pyramid, wedge, polygon or corrugation, thereby forming a board for setting up a wave absorber.

Figure 1:
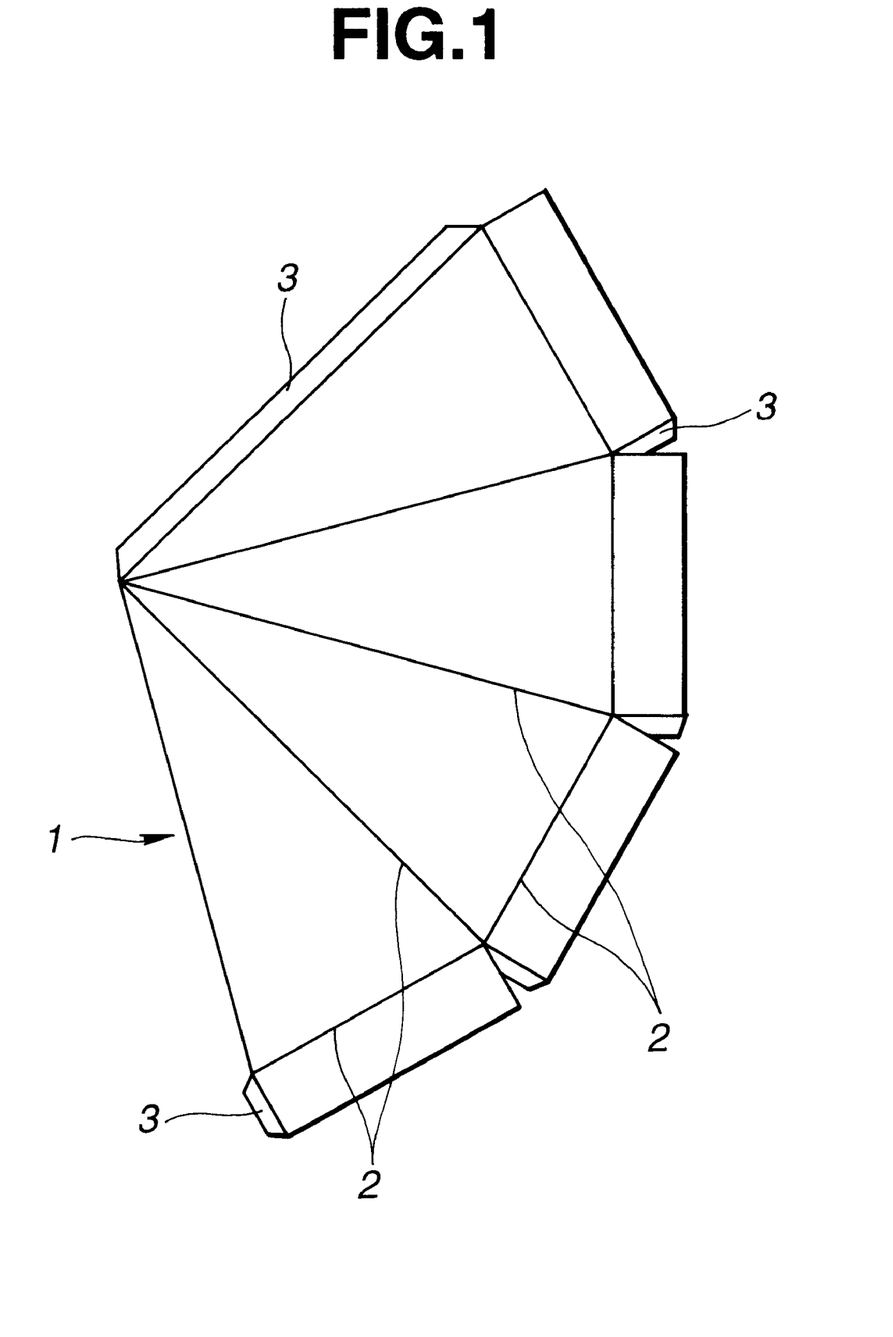
FIG. 1 is a plan view showing an example of a folding board for a wave absorber.

Especially, where a wave absorber body is set up and attached to in a relatively large pyramidal shape, a board is die-cut with scorers or folding lines in a developed pattern as shown in FIG. 1 (26 inch high pyramidal shape) wherein a development of a hollow pyramid with a final height of 26 inches is shown, thereby permitting the die-cut board to be readily set up on the spot where applied. In FIG. 1, reference numeral 1 indicates a board 1 to be set up, which has folding lines 2 and bonding portions 3 (lugs for bonding margin).

Figure 2:
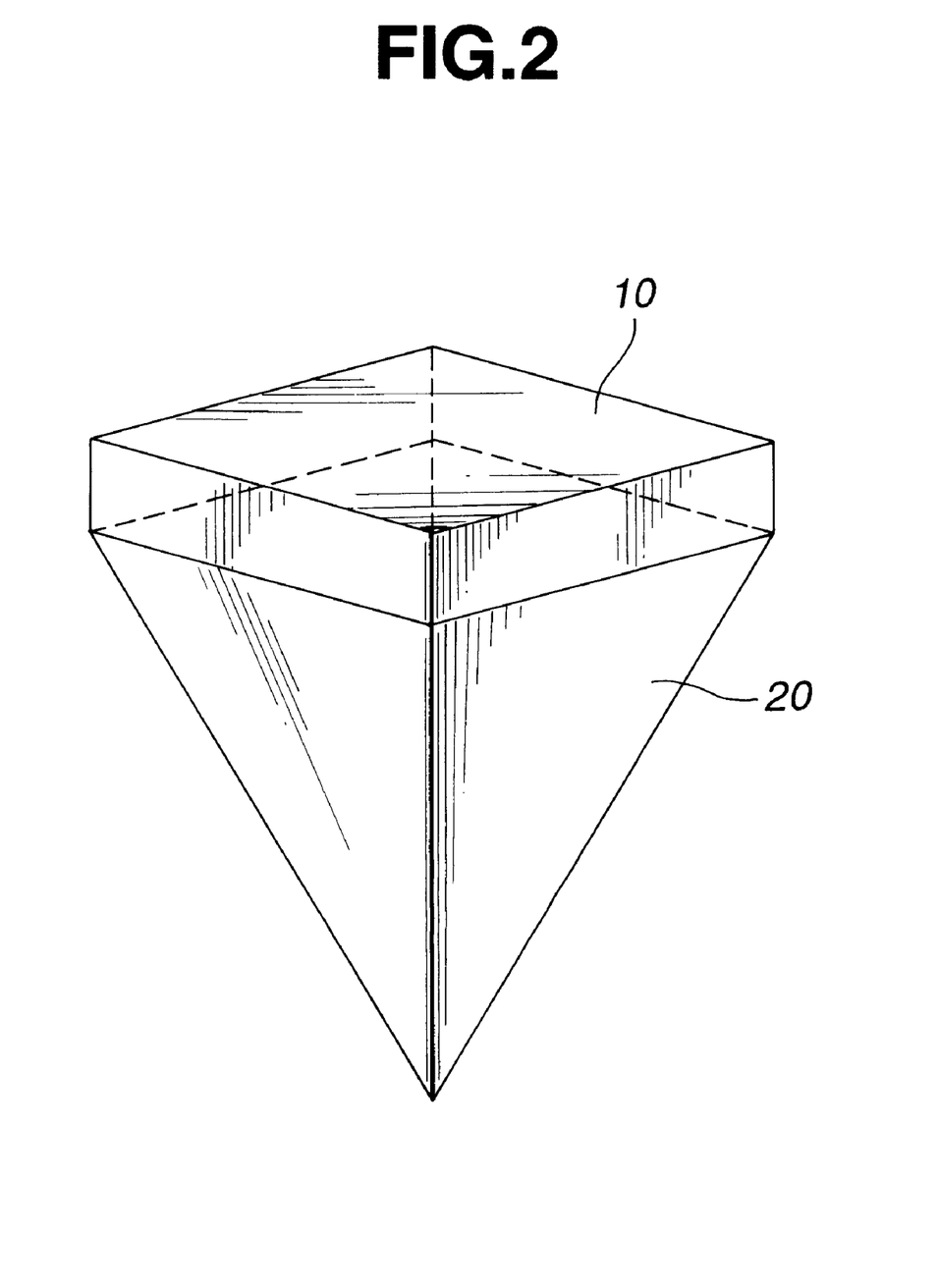
FIG. 2 is a perspective view showing a wave absorber according to one embodiment of the invention.
Figure 3:
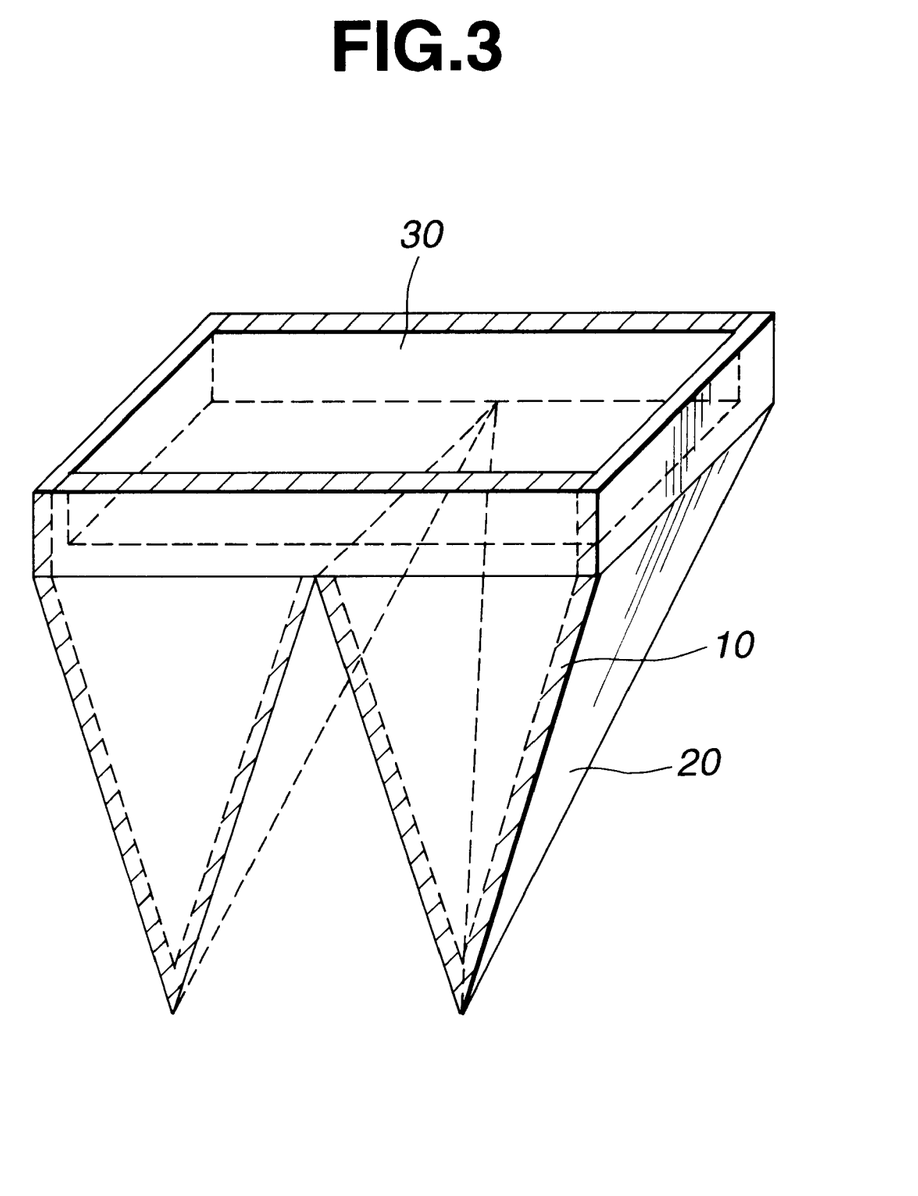
FIG. 3 is a perspective view showing a wave absorber according to another embodiment of the invention.

As shown in FIGS. 2 and 3, the board 1 is set up into a hollow pyramid, wedge, polygon or corrugation on the spot for a field-free chamber to provide a wave absorber body 10, followed by attachment to wall, ceiling or floor surfaces of the field-free chamber. In this manner, the board to be set up can be forwarded in the form of a flat sheet prior to setup, and thus, ensures a reduced loadage at the time of transportation and a reduced space at the application spot. Thus, transportation and setup costs can be reduced, with the fabrication costs of the board being low, thus leading to cost saving in this respect. Thus, a considerable cost reduction can be realized as whole.

It will be noted that when a relatively small-sized pyramidal shape with a height of 12 inches or below or a wedge shape is formed, an uncured board is shaped into a polygonal or corrugated form at the time of hot pressing and curing and then into a final form by use of male and female molds. In this case, the application thereof on the spot requires only attaching or mounting operations.

Further, folding portions and/or bonding portions may be applied with an adhesive or self-adhesive or a double-coated tape, or attached with various types of fasteners or magic tapes. Especially, when fasteners or magic tapes are employed, a once set-up wave absorber body can be readily collapsed.

Cap

The cap is mounted on the wave absorber body to cover the body therewith. In FIGS. 2 and 3, reference numeral 20 indicates a cap.

The cap, which is made of an incombustible air-permeable sheet selected from glass fiber-woven fabrics, glass fiber non-woven fabrics, laminates of glass fiber-woven or non-woven fabrics and flame-retardant or incombustible organic fiber-woven or non-woven fabrics, and flame-retardant or incombustible organic fiber-woven or non-woven fabrics, may be processed in the form of a hollow pyramid, wedge, polygon or corrugation corresponding to the form of the absorber body.

The cap is incombustible and has great tear strength, and is attached, by adhesion, to the surface of the wave absorber body after or prior to the on-the-spot setup of a wave absorber body. In this manner, the wave absorber is physically reinforced and is improved in mechanical strength and breakage resistance while keeping the incombustibility. Hence, durability is also improved. In this case, if the cap is colored with a bright color, design properties can be imparted.

In particular, such a cap is made by providing a sheet made of a laminate between a glass fiber-woven or non-woven fabric and a flame-retardant or incombustible organic non-woven fabric (e.g. incombustible paper) or woven fabric (e.g. a flame-retardant rayon woven fabric or a rayon carbonized woven fabric) and having a basis weight of 150 $g/m^2$ to 500 $g/m^2$, or a sheet made of a flame-retardant or incombustible organic or inorganic fiber-woven fabric (aramid woven fabric or Kynol woven fabric) or a laminate between the woven fabric and a flame-retardant or incombustible organic non-woven fabric and having a basis weight of 150 $g/m^2$ to 500 $g/m^2$, and shaping the sheet, for example, in the form of a pyramid as shown in FIG. 2 (e.g. a single pyramid or a plurality of pyramids connected in line).

The cap should conveniently have such properties as incombustibility, a limited oxygen index (LOI) of 30 or over, high air permeability from the standpoint of acoustic characteristics, good design properties and great tear strength, by which such properties as set out hereinbefore can be imparted to a wave absorber.

Base

The base is made of a board, which is so shaped as to be inserted at the bottom of a pyramid, wedge, polygon or corrugation-shaped wave absorber and which is incombustible, light in weight and electromagnetically transparent and is matched in impedance with ferrite tiles.

In more detail, the wave absorber body is bonded to and arranged on surfaces of walls, a ceiling and a floor of a field-free chamber and, if necessary, to ferrite tile surfaces by application of an adhesive, such as an epoxy resin, to the peripheral portions of the bottom of the absorber body. With the pyramid or wedge-shaped absorber having a relatively heavy weight, it is beneficial to provide a base obtained by processing a lightweight board and fix the base by means of an adhesive after insertion into the bottom of the wave absorber body at a stage of setting up the absorber body.

Such a base-bearing wave absorber has good shape retention. Since an adhesive can be applied onto the entire bottom surface at the time of attachment of the absorber, troubles such as a drop of the absorber body after having been attached to can be avoided. Moreover, if the base is able to be matched in characteristic impedance with ferrite tiles, an improvement in wave absorption properties may be expected.

The materials for the base obtained by processing an incombustible, lightweight board include a phenolic foam having a bulk density of 40 to 100 kg/m$^3$, a glass wool board and a rock wool board having a bulk density of 40 to 200 kg/m$^3$, a mineral fiber board having a bulk density of 400 kg/m$^3$ or below, and the above-mentioned boards to which a small amount of carbon is added.

Although the thickness of the board can be arbitrarily set depending on the height of the bottom portion of the wave absorber, it is usually necessary from the standpoint of processability and adhesiveness that the thickness be 10 mm or over. An example of a finally set-up wave absorber article in its entirety according to the invention is shown in FIG. 3. In FIG. 3, reference numeral 30 indicates a base or pedestal.

The constituent materials of the wave absorbed according to the invention are, respectively, those set forth hereinbefore. In order to reduce production costs and improve the performance of the absorber within a range not impeding the purposes of the invention, flame-retardants, lightweight aggregates, ferrite powder, and conductive fibers such as carbon fibers may be formulated in constituent materials for a wave absorber body, a cap and a base in small amounts, respectively.

The wave absorption properties of the thus obtained wave absorber should preferably be in the range of 10 to 60 dB, more preferably from 15 to 55 dB, and most preferably from 20 to 50 dB in the range of 500 MHz to 50 GHz.

When the wave absorber of the invention is of the type which has a thickness of 20 mm and a bulk density of 80 kg/m$^3{}_1$, for example, its acoustic absorptivity (determined according to an anechoic chamber method described in JIS A 1409) is generally in the range of 65 to 90% at 125 Hz, preferably 69 to 80% and is in the range of 80 to 100% at 500 Hz to 4000 Hz, preferably 90 to 100%. Moreover, when determined by a fireproof test of JIS A 1321, the absorber should pass first-rate flame-retardant (incombustibility rate notified by the Ministry of Construction).

According to the invention, a dielectric loss material such as carbon can be readily, incorporated in during the course of the step of forming heat-resistant, incombustible glass wool fibers or the step of making rock wool and removing shot therefrom according to a dry or wet process, thereby obtaining a composite wave absorber. When the bulk density is so controlled as to be at 400 kg/m$^3$ or below, preferably at 200 kg/m$^3$ or below, the resultant absorber has both good wave absorption and acoustic absorption properties. In addition, when using an incombustible cap and an incombustible base in combination, good shape retention, strength, durability and design properties can be imparted to the wave absorber, and the incombustible wave absorption can be set up and attached to on the spot where applied.

EXAMPLES

The invention is more particularly described by way of examples, which should not be construed as limiting the invention thereto.

[Example 1]

A starting material for glass wool was melted in an electric furnace and passed to a spinning device (spinner) composed of a vertical, perforated, high-speed rotator. The resultant glass wool was sprayed with an aqueous dispersion of water-soluble phenolic resin and carbon fine powder (BP-3500, Cablock Inc.) through a plurality of spray nozzles disposed around the spinning device, followed by collecting and shaping the resulting glass wool to obtain three types of uncured glass wool mats having a thickness of 15 mm, a bulk density of 35 kg/m$^3$, an amount of deposited phenolic resin (solid content) of 6 wt %, and carbon concentrations of 1 g/liter, 3 g/liter and 5 g/liter.

The three pieces of the uncured glass wool mat having a carbon concentration of 1 g/liter were stacked. A polyester non-woven fabric with a basis weight of 20 g/m$^2$ was further placed on opposite sides of the stacked mat pieces and subjected to thermoforming under conditions of 170° C. and 20 minutes, thereby making a glass wool board having a thickness of 15 mm, a bulk density of 105 kg/m$^3$, and a carbon concentration of 3 g/liter.

This board was formed with folding and bonding portions in the form of a 26 inch high pyramidal shape as shown in FIG. 1 and die-cut to provide a board capable of being set up (hereinafter referred to simply as A-1).

Three pieces of the uncured grass wool mat having a carbon concentration of 5 g/liter were stacked and subjected to thermoforming in the same manner as set out above to obtain a glass wool board having a thickness of 15 mm, a bulk density of 105 kg/m$^3$ and a carbon concentration of 15 g/liter. The thus obtained board was formed with folding and bonding portions in the form of a 26 inch high hollow pyramid as shown in FIG. 1 and die-cut to provide a board capable of being set up (hereinafter referred to as A-2).

Further, the uncured glass wool mats, respectively, having carbon concentrations of 1 g/liter, 3 g/liter and 5 g/liter were stacked in total of the three mats, followed by thermoforming in the same manner as set out above to obtain a glass wool board having a thickness of 15 mm, a bulk density of 105 kg/m$^3$ and a carbon concentration of 11.3 g/liter. The board was formed with folding and bonding portions in the form of a developed 26 inch high hollow pyramid as shown in FIG. 1, followed by die-cutting to obtain a board capable of being set up (hereinafter referred to as A-3).

[Example 2]

Commercially sold rock wool granular cotton (granular cotton #42 of Nitto Boseki Co., Ltd.) was charged into a pulper having rotary blades and dispersed in water (dispersed solid content: about 5 wt %), followed by rotation at a high speed for 3 minutes to defibrate and cut the rock wool into finer pieces. Subsequently, non-fibrous particles (shot) were separated and removed from the thus defibrated and cut rock wool by means of a water jet cleaner/shot separator, thereby obtaining shot-removed rock wool.

There was provided a starting composition, which was composed of 93.5 wt % of the shot-removed rock wool, 1 wt % of ethylene-propylene fibers (cut length of 5 mm), an acrylic resin emulsion (concentration: 40 wt %, calculated at 5 wt % as a solid content), an acrylamide coagulant (concentration: 15 wt %, calculated at 0.3 wt % as a solid content), and an aluminium sulfate dispersion aid (concentration: 50 wt %, calculated at 0.2 wt % as a solid content). Carbon (BP-3500, Cablock Inc.) was added to and dispersed in the starting composition so that a concentration of carbon in a finally made board having a thickness of 5 mm and a bulk density of 250 kg/m$^3$ was at 15 g/liter, thereby preparing an aqueous slurry having a solid content of about 4 wt % in a mixing tank.

Thereafter, the slurry was subjected to a rotoformer paper machine of both cylinder and Fourdrinier types, dehydrated and dried to obtain a rock wool felt having a thickness of 5 mm, a bulk density of 250 kg/m$^3$ and a carbon concentration of 15 g/liter. The three pieces of the rock felt were stacked, and a polyester non-woven fabric with a basis weight of 20 g/m$^2$ was placed on opposite sides of the stacked felt, followed by needling through needle punching and drying in a drying furnace at 150° C. for 10 minutes to obtain a rock wool board having the molten organic fibers deposited thereon.

The thus obtained board was formed with folding and bonding portions in the form of a developed 26 inch high pyramid as shown in FIG. 1, followed by die-cutting to provide a board capable of being set up (hereinafter referred to as A-4).

[Example 3]

A beige-colored plain glass cloth having a basis weight of 180 g/m$^2$ and a calcium silicate fiber inorganic paper (with a basis weight of 120 g/m$^2$) were laminated by use of an acrylic emulsion adhesive, followed by die-cutting and bonding in such a shape as shown in FIG. 1 to provide an incombustible cap in the form of a single pyramid as shown in FIG. 2.

[Example 4]

An incombustible phenolic foam board (Fire Lock FN-25 of Nitto Boseki Co., Ltd.) having a foam density of 40 kg/m$^3$ and a thickness of 25 mm, and also having inorganic paper face sheets thereon was processed to provide a circumferentially taped base having a size of 30×30 cm.

[Example 5]

The boards A-1 to A-4 were each set up to provide a wave absorber body in the form of a hollow pyramid, and the base obtained in Example 4 was inserted into the bottom of the pyramid. The end faces and the peripheral portions of the base were bonded by means of a two-pack epoxy resin, thereby providing a 26 inch high wave absorber in the form of a hollow pyramid.

The wave absorbers were each applied with a two-pack epoxy resin adhesive at the bottom thereof, and bonded and fixed to a wall surface which was covered with Ni—Zn ferrite tiles with a thickness of 4.5 mm. Thus, the absorbers were attached to in an application-on-the-spot manner. Further, a rubber adhesive was sprayed over the surfaces of each absorber thinly, and the incombustible cap of Example 3 was mounted on the absorber for final finishing.

The weight of the single pyramid of the thus obtained wave absorber was as light as about 1.1 kg, and a satisfactory reinforcing effect with the cap was obtained. Thus, the wave absorber, which had good design properties, a clear appearance and a good shape retention, could be applied to.

The wave absorption properties, acoustic absorption properties and fireproof properties were measured according to the following methods. The results are shown in Table 1.

Wave absorption properties

These properties were measured and evaluated according to a network analyzer with respect to the MHz frequency range and according to an arch test with respect to the GHz frequency range.

Measurement of acoustic absorptivity

The absorptivity was measured and evaluated according to an anechoic chamber method described in JIS A 1409.

Evaluation of fireproof property

The fireproof property was evaluated according to a base material testing method of JIS A 1321 (wherein the temperature was set at 750° C., with a pass through first-rate flame-retardancy (incombustibility) at a temperature of 800° C. or below of a base material test).

TABLE 1

| Type of absorber | | A-1 | A-2 | A-3 | A-4 |
|---|---|---|---|---|---|
| Content of carbon (g/liter) | | 3 | 15 | 11.3 | 15 |
| Wave absorption properties (dB) | | | | | |
| Frequencies for measurement | 500 MHz | 21 | 35 | 36 | 34 |
| | 1 GHz | 30 | 41 | 40 | 39 |
| | 10 GHz | 35 | 49 | 51 | 46 |
| | 50 GHz | 35 | 51 | 53 | 45 |
| Acoustic absorption properties (%) | | | | | |
| Frequencies for measurement | 125 Hz | 75 | 74 | 76 | 69 |
| | 500 Hz | 100 | 98 | 100 | 99 |
| | 1000 Hz | 100 | 100 | 100 | 100 |
| | 2000 Hz | 100 | 100 | 100 | 100 |
| | 4000 Hz | 100 | 100 | 100 | 100 |
| Fireproof properties (° C.) | | 793 | 796 | 795 | 795 |
| | | First-rate flame-retardancy (incombustibility) | First-rate flame-retardancy (incombustibility) | First-rate flame-retardancy (incombustibility) | First-rate flame-retardancy (incombustibility) |

[Example 6]

A commercially available, open-cell, melamine resin foam block (commercial name of "Basotect" of BASF, with a bulk density of 11 kg/m$^3$) was dipped in a dispersion of carbon black and a binder. Followed by uniform squeeze with rollers and drying at 80° C. for 2 hours to obtain a melamine resin foam board having a thickness of 20 mm and a carbon concentration of 5 g/liter.

The board was formed with folding and bonding portions in the form of a developed 26 inch high pyramid as shown in FIG. 1 and die-cut to provide a board capable of being set up (hereinafter referred to as B-1).

[Example 7]

In the same manner as in Example 6, a melamine resin foam board having a thickness of 20 mm and a carbon concentration of 5 g/liter was made. A polycarbodiimide resin (Carbodilight of Nissinbo Industries, Inc.) was applied onto the surfaces of the board, followed by placing a polyester non-woven fabric on opposite sides thereof and thermoforming to obtain an organic fiber-composited melamine resin foam board.

The board was formed with folding and bonding portions in the form of a developed 26 inch high pyramid as shown in FIG. 1 and die-cut to provide a board capable of being set up (hereinafter referred to as B-2).

[Example 8]

The boards B-1 and B-2 were each set up, and the base obtained in Example 4 was inserted into the bottom thereof.

The end faces and the peripheral portions of the base of these boards were bonded by means of a two-pack epoxy resin to make 26 inch high hollow pyramid-shaped wave absorbers. Each wave absorber was applied with a two-pack epoxy resin adhesive at the bottom thereof, and bonded and fixed to a wall surface that was covered with Ni—Zn ferrite tiles with a thickness of 4.5 mm. Thus, the absorber was attached to in an application-on-the-spot manner. Moreover, a rubber adhesive was sprayed in small amounts on the surfaces of the wave absorber, following by attachment of the incombustible cap for final finishing.

The single pyramid of the thus obtained wave absorber was as light as about 0.3 kg in weight, and a satisfactory reinforcing effect with the cap was obtained. The applied wave absorber had good design properties, a clear appearance, and a good shape retention.

The wave absorption properties of the wave absorber were measured in the same manner as described hereinbefore. The acoustic absorption properties and combustibility were, respectively, measured in the following manners. The results are shown in Table 2.

Measurement of acoustic absorptivity

The absorptivity was measured and evaluated by a method of measuring a vertical input acousic absorptivity for building materials based on a pipe method of JIS A 1405.

Evaluation of combustibility

This was evaluated according to a combustibility test of JIS A 9511.

TABLE 2

| Type of absorber | | B-1 | B-2 |
|---|---|---|---|
| Content of carbon (g/liter) | | 5 | 5 |
| Wave absorption properties (dB) | | | |
| Frequencies for measurement | 500 MHz | 20 | 21 |
| | 1 GHz | 25 | 27 |
| | 10 GHz | 35 | 38 |
| | 50 GHz | 35 | 39 |
| Acoustic absorption properties (%) | | | |
| Frequencies for measurement | 500 Hz | 17 | 34 |
| | 1000 Hz | 43 | 79 |
| | 2000 Hz | 68 | 100 |
| | 4000 Hz | 88 | 87 |
| Combustibility | | self-extinguishing | self-extinguishing |

According to the invention, a dielectric loss material such as carbon can be incorporated in or throughout incombustible, heat-resistant inorganic short fibers or melamine resin foams according to an economical process, thereby imparting wave absorption properties, acoustic absorption properties, fireproof properties, shape retention, strength, durability, maintenance and design properties to the resultant composite material. Additionally, a field-free chamber using a wave absorber of the invention serves also as an anechoic chamber.

The board capable of being set up according to the invention can be efficiently transported in a compact manner to an application spot. The board is not only ready for setup, but also easily collapsible, taking only a little space for accommodation.

What is claimed is:

1. An incombustible wave absorber of the application-on-the-spot type which comprises:
  a wave absorber body made of a board selected from the group consisting of
  (a) an incombustible, carbon-containing, inorganic short fiber board wherein fine powder of carbon is deposited on the surfaces of inorganic short fibers,
  (b) an incombustible carbon-containing inorganic short fiber board obtained by laminating, on one or both sides of an inorganic short fiber board, a fire-retardant or incombustible organic or inorganic fiber-woven or non-woven fabric having a carbon fine powder-containing resistance film therein,
  (c) an organic foam board having carbon fine powder incorporated in a melamine resin foam by impregnation, and
  (d) a board obtained by laminating, on one side or both sides of an organic foam board having carbon fine powder incorporated in a melamine resin foam by impregnation, an organic or inorganic fiber-woven or non-woven fabric, or a fire-retardant or incombustible organic or inorganic fiber-woven or non-woven fabric having a carbon fine powder-containing resistance film formed therein, wherein said board is formed with folding portions and/or bonding portions so that said board is able to be set up on the spot in the form of a hollow pyramid, wedge, polygon or corrugation, and is set up in the form of the hollow pyramid, wedge, polygon or corrugation to provide a wave absorber body to be attached to surfaces of walls, a ceiling or a floor of a field-free chamber; and
  an incombustible cap mounted on said absorber body.

2. An incombustible wave absorber according to claim 1, wherein the inorganic short fibers constituting said incombustible carbon-containing inorganic short fiber board consists essentially of glass wool or shot-removed rock wool.

3. An incombustible wave absorber according to claim 1, wherein said carbon-containing inorganic short fiber board making use of glass wool has a bulk density of 30 to 200 kg/m$^3$, a thickness of 5 to 20 mm, and a carbon concentration of 0.5 to 20 g/liter.

4. An incombustible wave absorber according to claim 1, wherein said carbon-containing inorganic short fiber board making use of rock wool has a bulk density of 200 to 400 kg/m$^3$, a thickness of 5 to 20 mm, and a carbon concentration of 0.5 to 20 g/liter.

5. An incombustible wave absorber according to claim 1, wherein the melamine resin foam has a bulk density of 8 to 13 kg/m$^3$, a thickness of 5 to 20 mm, and a carbon concentration of 0.5 to 30 g/liter.

6. An incombustible wave absorber according to claim 1, wherein said incombustible cap is made of an incombustible permeable sheet selected from sheets of glass fiber-woven and non-woven fabrics, laminates of glass fiber-woven and non-woven fabrics and flame-retardant or incombustible organic fiber-woven and non-woven fabrics, and flame-retardant or incombustible organic fiber-woven and non-woven fabrics, and is processed in the form of a hollow pyramid, wedge, polygon or corrugation.

7. An incombustible wave absorber according to claim 1 further comprising a base attached to the bottom of said wave absorber body wherein said base is made of an incombustible lightweight board capable of matching in impedance with a ferrite tile.

8. An incombustible wave absorber according to claim 1, wherein said wave absorber body is placed on ferrite tiles.

* * * * *